(12) United States Patent
Xiao

(10) Patent No.: US 10,113,227 B2
(45) Date of Patent: Oct. 30, 2018

(54) CRUCIBLE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Ang Xiao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 91 days.

(21) Appl. No.: 14/436,925

(22) PCT Filed: Sep. 28, 2014

(86) PCT No.: PCT/CN2014/087689
§ 371 (c)(1),
(2) Date: Apr. 20, 2015

(87) PCT Pub. No.: WO2015/165207
PCT Pub. Date: Nov. 5, 2015

(65) Prior Publication Data
US 2016/0122863 A1   May 5, 2016

(30) Foreign Application Priority Data
Apr. 30, 2014   (CN) .......................... 2014 1 0183581

(51) Int. Cl.
*C23C 14/12* (2006.01)
*C23C 14/24* (2006.01)

(52) U.S. Cl.
CPC ............ *C23C 14/243* (2013.01); *C23C 14/12* (2013.01); *C23C 14/246* (2013.01)

(58) Field of Classification Search
CPC ...... C23C 14/12; C23C 14/243; C23C 14/246
(Continued)

(56) References Cited

U.S. PATENT DOCUMENTS 4,023,523 A * 5/1977 Ing .................. C23C 14/243
118/726
5,820,649 A * 10/1998 Ogure .................. C30B 15/002
117/13
(Continued)

FOREIGN PATENT DOCUMENTS

CN   1550571 A   12/2004
CN   1606632 A   4/2005
(Continued)

OTHER PUBLICATIONS

International Search Report dated Jan. 18, 2015 issued in International Application No. PCT/CN2014/087689.
(Continued)

*Primary Examiner* — Steven B McAllister
*Assistant Examiner* — Benjamin W Johnson
(74) *Attorney, Agent, or Firm* — Nath Goldberg & Meyer; Joshua B. Goldberg

(57) ABSTRACT

The present invention provides a crucible, and belongs to the field of evaporation technology, for solving such problems of an existing crucible that evaporation material loss occurs in evaporation process, the crucible is inconvenient to clean, and the evaporation material filled in the crucible is not uniform. The crucible of the present invention includes a main cavity and a plurality of sub-cavities which are used for containing evaporation material and are arranged in the main cavity, each sub-cavity being provided with an opening. The crucible of the present invention may be used in preparation of an OLED device.

12 Claims, 2 Drawing Sheets

(58) Field of Classification Search
USPC .................................. 432/262, 263, 264, 265
See application file for complete search history.

(56) References Cited

U.S. PATENT DOCUMENTS

| | | | | |
|---|---|---|---|---|
| 5,906,857 | A * | 5/1999 | McKee | C23C 14/542 |
| | | | | 118/688 |
| 6,830,626 | B1 * | 12/2004 | Smith | C23C 14/243 |
| | | | | 118/724 |
| 8,206,507 | B2 * | 6/2012 | Yamazaki | C23C 14/042 |
| | | | | 118/726 |
| 8,591,223 | B2 * | 11/2013 | Hein | B01B 1/005 |
| | | | | 427/255.6 |
| 2006/0283382 | A1 * | 12/2006 | Yoshikawa | C23C 14/243 |
| | | | | 117/200 |
| 2011/0146575 | A1 * | 6/2011 | Choi | C23C 14/243 |
| | | | | 118/721 |

FOREIGN PATENT DOCUMENTS

| | | |
|---|---|---|
| CN | 102102175 A | 6/2011 |
| CN | 102102176 A | 6/2011 |
| CN | 103502502 A | 1/2014 |
| CN | 103993268 A | 8/2014 |
| JP | 2003147510 A | 5/2003 |
| JP | 3839587 B2 | 11/2006 |
| KR | 20070112668 A | 11/2007 |

OTHER PUBLICATIONS

First Office Action dated Nov. 30, 2015 corresponding to Chinese application No. 201410183581.7.
Office Action dated May 26, 2016 issued in corresponding Chinese Application No. 201410183581.7.
Kutz, "Environmentally Conscious Mechanical Design", pp. 207-208, Posts & Telecom Press, Jan. 31, 2010.

* cited by examiner

-- PRIOR ART --

CRUCIBLE

This is a National Phase Application filed under 35 U.S.C. 371 as a national stage of PCT/CN2014/087689, filed Sep. 28, 2014, and claims priority benefit from Chinese Application No. 201410183581.7, filed Apr. 30, 2014, the content of each of which is hereby incorporated by reference in its entirety.

FIELD OF THE INVENTION

The present invention belongs to the field of evaporation technology, and particularly relates to a crucible.

BACKGROUND OF THE INVENTION

Evaporation is a vacuum coating technology of physical vapor deposition, in which evaporation material is placed in a crucible, and through heating the crucible, the material is converted from solid to gas atoms, atom groups or molecules, and then accumulated on the surface of a substrate to be coated to form a film.

In evaporation process for manufacturing an OLED (Organic Light-Emitting Diode) display device, a linear evaporation source is adopted, with a crucible as the key component thereof. The existing crucible adopted in the evaporation process for manufacturing an OLED display device is designed to be an integrally cast crucible with a transverse span of, for example, about 0.8 m. As shown in FIG. 1, the existing integrally cast crucible includes a main cavity 10 for containing evaporation material, and a cover plate 20 covering the main cavity 10. Gas outlets 21 are provided on the cover plate 20, and generally, nozzles 22 are also provided correspondingly above the gas outlets 21, as passages for ejection of gas converted from solid evaporation material when the main cavity 10 is heated. However the inventor finds that as the transverse span (the span in the left-right direction shown in FIG. 1) is relatively long, there are at least the following problems: 1. as filling of the evaporation material, in order to uniformly add the material in the main cavity 10, an operator needs to fill the evaporation material while moving, which is very likely to cause leakage, drift and loss of the material, and as the OLED evaporation material is very expensive, the cost is increased due to the leakage, drift and loss; 2. the existing OLED evaporation material is powdered, and cannot be controlled to be uniformly distributed in the main cavity 10 during filling, which is likely to result in a thickness difference of the film formed by evaporation; 3. existing weighting scales cannot accurately measure the weight of such a large crucible and a total amount of the added material; and 4. after completion of evaporation, the material adhered in the main cavity 10 is difficult to clean.

SUMMARY OF THE INVENTION

In view of the above-mentioned problems of the existing crucible, the present invention provides a crucible with an innovative structure, so that waste of evaporation material can be avoided, the crucible is convenient to clean, and filling of the evaporation material is becoming more uniform.

A technical solution adopted to solve the technical problem of the present invention is a crucible, including a main cavity, and a plurality of sub-cavities which are arranged in the main cavity and are used for containing evaporation material, each of the sub-cavities being provided with an opening.

As the crucible of the present invention includes a plurality of sub-cavities, and the sub-cavities are smaller in volume than the main cavity, an operator does not need to fill the evaporation material while moving when the sub-cavities are used for containing the evaporation material, so that leakage, drift and loss of the evaporation material can be avoided; furthermore, as the sub-cavities are smaller in volume, the weights of each sub-cavity before and after filling can be more accurately weighed by using weighing scales, and then the mass of the filled evaporation material can be accurately calculated, to ensure that the amount of evaporation material filled in each one of the sub-cavities is more uniform; and of course, the sub-cavities are more convenient to clean after completion of evaporation process due to the smaller volume.

Preferably, the sub-cavities are detachably fixed in the main cavity.

Further preferably, the sub-cavities are detachably fixed to the bottom of the main cavity through first connecting devices.

Preferably, between any two adjacent sub-cavities, a conduit for mutual communication between said two sub-cavities is arranged; a through hole is formed on a side wall of each of the sub-cavities at a position being connected with the conduit; and the distance between the position of the through hole and the opening of the sub-cavity is not greater than 2 cm.

Further preferably, the diameter of the conduit is larger than that of the through hole.

Still further preferably, the conduit is detachably fixed to the side wall of the sub-cavity by a second connecting device.

Further preferably, a switch shutter matched with the through hole is further provided on the side wall of the sub-cavity.

Preferably, spaces between any two adjacent sub-cavities are equal.

Preferably, the crucible further includes a cover plate for closing the main cavity, and the cover plate is provided with a gas outlet.

Further preferably, a nozzle is arranged on the cover plate at a position corresponding to the gas outlet.

Figure 1:
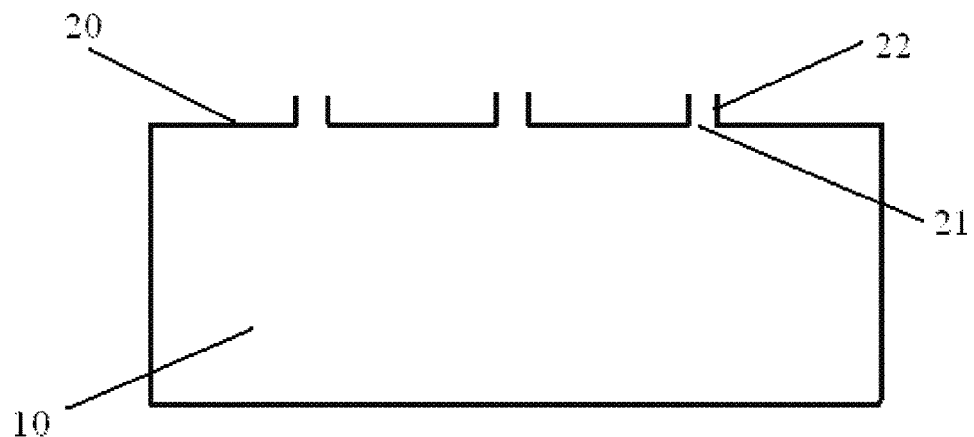
FIG. 1 is a structural schematic diagram of an existing crucible.

Reference numerals: 10 main cavity; 20 cover plate; 21 gas outlet; 22 nozzle; 30 sub-cavity; 31 through hole; 32 switch shutter; 40 first connecting device; 50 conduit; 60 second connecting device.

DETAILED DESCRIPTION OF THE EMBODIMENTS

To make a person skilled in the art better understand the technical solution of the present invention, the present invention is further described below in details in conjunction with the accompanying drawings and the specific implementations.

Embodiment 1

Figure 2:
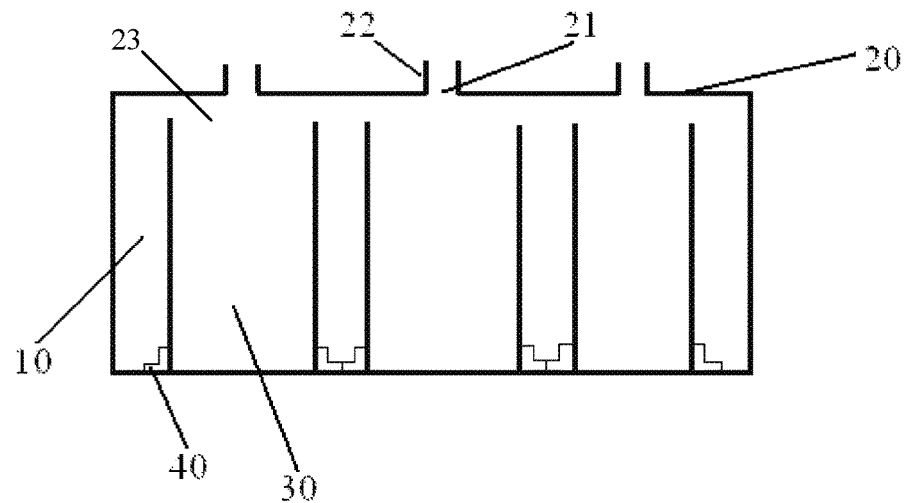
FIG. 2 is a structural schematic diagram of a crucible of embodiment 1 of the present invention.

Referring to FIG. 2, this embodiment provides a crucible, including a main cavity 10 and a plurality of sub-cavities 30 which are arranged in the main cavity 10 and are used for containing evaporation material, wherein each sub-cavity 30 has a hollow cavity structure with an opening 23 above.

The main cavity 10 is shown in the schematic diagram of this embodiment to include three sub-cavities 30; however, it should be understood that the present invention is not limited thereto. Two or more sub-cavities are also encompassed within the protection scope of the present invention. As the sub-cavities 30 are smaller in volume than the main cavity 10, an operator does not need to fill the evaporation material while moving when the sub-cavities 30 are used for containing the evaporation material, so that leakage, drift and loss of the evaporation material can be avoided; furthermore, as the sub-cavities 30 are smaller in volume, the weights of each sub-cavity before and after filling can be more accurately weighed by using weighing scales, and then the mass of the filled evaporation material can be accurately calculated, to ensure that the amount of evaporation material filled in each one of the sub-cavities 30 is more uniform; and of course, the sub-cavities 30 are more convenient to clean after completion of evaporation process due to the smaller volume.

In this embodiment, the sub-cavities 30 need to be cleaned after completion of evaporation. For convenience of cleaning, the sub-cavities 30 are preferably detachably fixed within the main cavity 10. Further preferably, in order to enable the sub-cavities 30 arranged in the main cavity 10 to be firm structurally, first connecting devices 40 are provided on the bottom of the main cavity 10, for detachable fixation with the sub-cavities 30. The first connecting devices 40 may be bolts, holders or other devices that can be combined for fixation. With this structure, the sub-cavities 30 may be taken out of the main cavity 10, to facilitate cleaning thereof.

Embodiment 2

Figure 3:
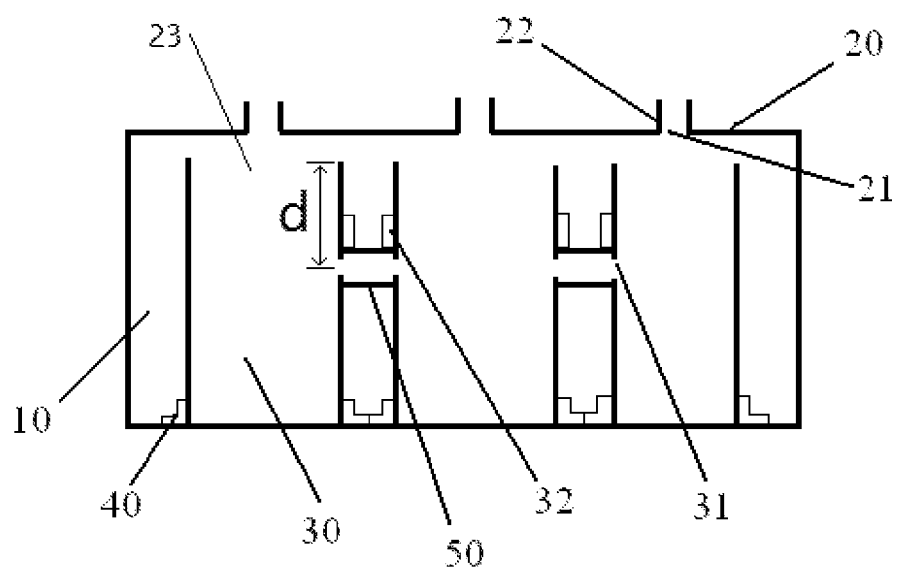
FIG. 3 is a structural schematic diagram of a crucible of embodiment 2 of the present invention.

Referring to FIG. 3, in this embodiment, in order to ensure uniform pressure intensity in the whole main cavity 10 to achieve a uniform thickness of a film formed by evaporation on a substrate, preferably, between any two adjacent sub-cavities 30, a conduit 50 for mutual communication between the two sub-cavities is arranged. A through hole 31 is formed on a side wall of each of the sub-cavities 30 at a position being connected with the conduit 50. The distance d between the position of the through hole 31 and the opening 23 of the sub-cavity 30 is not greater than 2 cm, because the evaporation material is usually filled to be lower than 2 cm below the opening 23 of the sub-cavity 30. In this embodiment, as the sub-cavities 30 are communicated, in this case the sub-cavities 30 are equivalent to an integrally communicated container, so that the pressure intensity above the openings of the internal sub-cavities 30 is more uniform when the whole main cavity 10 is heated for evaporation. It needs to be noted that the conduit 50 may be made of the same material as the main cavity 10 and the sub-cavities 30.

Further preferably, the diameter of the conduit 50 is larger than that of the through hole 31. The conduit 50 is detachably fixed to the side wall of the sub-cavity 30 by second connecting devices 60. That is to say, an opening of the conduit 50 entirely covers the through hole 31 of the sub-cavity 30, and is detachably fixed to the side wall of the sub-cavity 30 by the second connecting devices 60. The second connecting devices 60 may be bolts, holders or other devices that can be combined for fixation. The configuration enables the conduit 50 to be mounted after the sub-cavities 30 are filled with the evaporation material, to facilitate accurate weighting of the sub-cavities 30 while filling the evaporation material, and ensure the same filling amount of the evaporation material in the sub-cavities 30.

Figure 4:
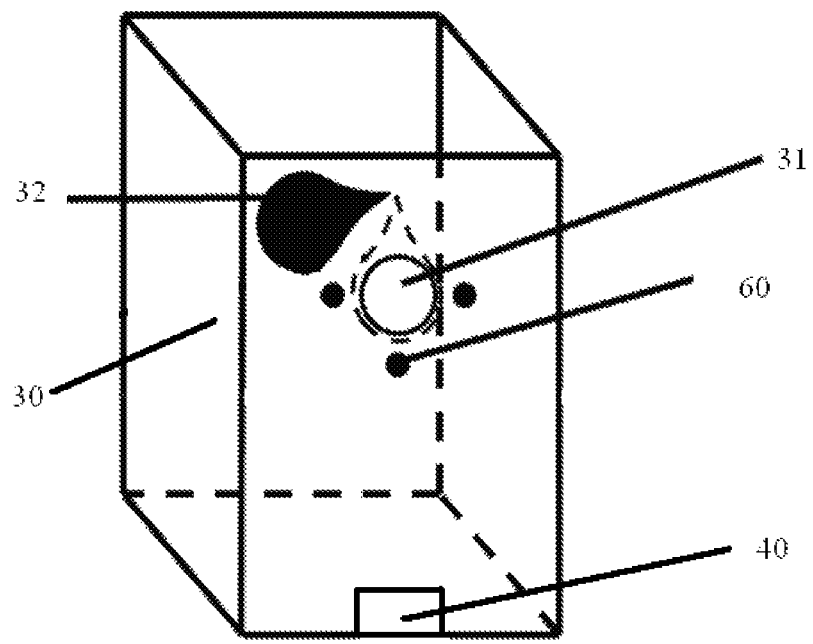
FIG. 4 is a perspective view of a sub-cavity of embodiment 2 of the present invention.

As shown in the perspective view of each sub-cavity 30 of FIG. 4, a switch shutter 32 matched with the through hole 31 is also provided on the side wall of the sub-cavity 30 in this embodiment. The switch shutter 32 closes the though hole 31 on the side wall of the sub-cavity 30 when the sub-cavity 30 is being filled with the evaporation material, to prevent leakage, drift and loss of the powered evaporation material during filling. The switch shutter 32 is opened after filling of the evaporation material in the sub-cavity 30 is completed, so that the sub-cavities 30 are communicated through the conduit 50.

Preferably, the spaces between any two adjacent sub-cavities 30 are equal. This can further ensure a uniform thickness of the film formed on the substrate by evaporation process. It needs to be noted that the sub-cavities 30 may be arranged in a column, and of course may also be arranged in a row along the transverse extension direction of the main cavity 10.

Of course, preferably the crucible of the embodiments of the present invention may further include a cover plate 20 for closing the main cavity 10, and the cover plate 20 is provided with gas outlets 21. The gas outlets 21 serve as passages for ejection after solid material is turned to gas when the main cavity 10 is heated. To prevent waste of ejected gas atoms, atom groups and molecules, further preferably, nozzles 22 are arranged on the cover plate 20 at positions corresponding to the gas outlets 21. The gas atoms, atom groups and molecules generated in evaporation process are ejected by the nozzles 22 to the surface of the substrate to form a film.

It should be understood that the above implementations are only exemplary implementations for illustrating the principle of the present invention, however, the present invention is not limited thereto. Various variations and improvements can be made by a person of ordinary skill in the art without departing from the spirit and essence of the present invention, and these variations and improvements should also be considered to be within the protection scope of the present invention.

The invention claimed is:

1. A crucible, comprising a main cavity, wherein the crucible further comprises a plurality of sub-cavities which are arranged in the main cavity and are used for containing solid evaporation material, each of the sub-cavities being provided with an opening, wherein between any two adjacent sub-cavities, a conduit for mutual communication between said two adjacent sub-cavities is arranged and a through hole is formed on a side wall of each of the two adjacent sub-cavities at a position that connects the through hole with the conduit, wherein the through hole penetrates a side of each of the two adjacent sub-cavities at a position below the respective opening, wherein the conduit is detachably fixed to the side wall of each of the two adjacent sub-cavities by a connecting device, wherein the conduit is made of a same material as the main cavity and the sub-cavities, and wherein a switch shutter is provided on the side wall of each of the two adjacent sub-cavities and aligned with the through hole formed on each of the two adjacent sub-cavities.

2. The crucible according to claim 1, wherein the sub-cavities are detachably fixed in the main cavity.

3. The crucible according to claim 2, wherein the sub-cavities are detachably fixed to a bottom of the main cavity through first connecting devices.

4. The crucible according to claim 1, wherein a distance between the position of the through hole and the opening of each adjacent sub-cavity is not greater than 2 cm.

5. The crucible according to claim 1, wherein an inner diameter of the conduit is larger than a diameter of the through hole of each of the two adjacent sub-cavities.

6. The crucible according to claim 1, wherein spaces between any two adjacent sub-cavities are equal.

7. The crucible according to claim 2, wherein spaces between any two adjacent sub-cavities are equal.

8. The crucible according to claim 3, wherein spaces between any two adjacent sub-cavities are equal.

9. The crucible according to claim 4, wherein spaces between any two adjacent sub-cavities are equal.

10. The crucible according to claim 5, wherein spaces between any two adjacent sub-cavities are equal.

11. The crucible according to claim 1, wherein the crucible further comprises a cover plate for closing the main cavity, and the cover plate is provided with a gas outlet.

12. The crucible according to claim 11, wherein a nozzle is arranged on the cover plate at a position corresponding to the gas outlet.

* * * * *